(12) United States Patent
Shermer, IV et al.

(10) Patent No.: US 6,429,513 B1
(45) Date of Patent: Aug. 6, 2002

(54) ACTIVE HEAT SINK FOR COOLING A SEMICONDUCTOR CHIP

(75) Inventors: Charles A. Shermer, IV, Chandler; Thomas P. Glenn, Gilbert, both of AZ (US); Steven Webster, Manila (PH); Donald Craig Foster, Mesa, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/866,100

(22) Filed: May 25, 2001

(51) Int. Cl.[7] .............................................. H01L 23/34
(52) U.S. Cl. ........................ 257/714; 257/715; 438/106; 438/121
(58) Field of Search ................................. 257/714, 715; 438/106, 121

(56) References Cited

U.S. PATENT DOCUMENTS

| | | | |
|---|---|---|---|
| 5,041,902 A | 8/1991 | McShane | 257/706 |
| 5,131,233 A * | 7/1992 | Cray et al. | 62/64 |
| 5,328,870 A | 7/1994 | Marrs | 29/827 |
| 5,355,283 A | 10/1994 | Marrs et al. | 361/760 |
| 5,381,042 A | 1/1995 | Lerner et al. | 257/712 |
| 5,455,462 A | 10/1995 | Marrs | 257/796 |
| 5,471,011 A | 11/1995 | Maslakow | 174/52.4 |
| 5,478,007 A | 12/1995 | Marrs | 228/180.22 |
| 5,482,898 A | 1/1996 | Marrs | 29/827 |
| 5,485,037 A | 1/1996 | Marrs | 257/712 |
| 5,583,378 A | 12/1996 | Marrs et al. | 257/710 |
| 5,629,561 A | 5/1997 | Shin et al. | 257/712 |
| 5,650,593 A | 7/1997 | McMillan et al. | 174/52.4 |
| 5,701,034 A | 12/1997 | Marrs | 257/706 |
| 5,708,567 A | 1/1998 | Shim et al. | 361/723 |
| 5,722,161 A | 3/1998 | Marrs | 29/841 |
| 5,723,899 A | 3/1998 | Shin | 257/666 |
| 5,729,432 A | 3/1998 | Shim et al. | 361/690 |
| 5,807,768 A | 9/1998 | Shin | 438/127 |
| 5,852,870 A | 12/1998 | Freyman et al. | 29/841 |
| 5,854,511 A | 12/1998 | Shin et al. | 257/713 |
| 5,854,741 A | 12/1998 | Shim et al. | 361/813 |
| 5,859,475 A | 1/1999 | Freyman et al. | 257/738 |
| 5,866,939 A | 2/1999 | Shin et al. | 257/666 |
| 5,947,193 A * | 9/1999 | Adkins et al. | 165/104.26 |
| 5,985,695 A | 11/1999 | Freyman et al. | 438/112 |
| 6,028,354 A | 2/2000 | Hoffman | 257/706 |
| 6,117,705 A | 9/2000 | Glenn et al. | 438/106 |
| 6,124,637 A | 9/2000 | Freyman et al. | 257/736 |
| 6,150,709 A | 11/2000 | Shin et al. | 257/666 |
| 6,198,163 B1 | 3/2001 | Crowley et al. | 257/706 |
| 6,222,731 B1 | 4/2001 | Katsui | 361/697 |
| 6,229,204 B1 * | 5/2001 | Hembree | 257/675 |

FOREIGN PATENT DOCUMENTS

JP              62014446 A   *   1/1987  ................. 257/714

* cited by examiner

*Primary Examiner*—Nathan Flynn
*Assistant Examiner*—Scott R. Wilson
(74) *Attorney, Agent, or Firm*—Skjerven Morrill LLP; James E. Parsons; Celisa Date

(57) ABSTRACT

Semiconductor packages and other electronic assemblies having an active heat sink are disclosed, along with methods of making the same. The active heat sink includes a cavity partially filled with a heat activated liquid. Heat generated during operation of a chip boils the heat activated liquid. The vapor condenses on an inner surface of the active heat sink and transfers heat to an outer, possibly finned, surface exposed to ambient to dissipate heat. In some embodiments, the active heat sink may be a closed vessel mounted on the chip. In some embodiments, the vessel of the active heat sink is formed from a die pad of a leadframe substrate. The die pad includes a recess that forms the active heat sink cavity when bonded to the back surface of the chip. The heat activated liquid directly contacts the back surface of the chip in these embodiments.

48 Claims, 7 Drawing Sheets

ACTIVE HEAT SINK FOR COOLING A SEMICONDUCTOR CHIP

BACKGROUND

1. Field of the Invention

The present invention relates to packages for semiconductor chips or other electronic devices.

2. Description of the Related Art

A typical package for a semiconductor chip includes an internal leadframe, which functions as a substrate for the package. The leadframe includes a central metal die pad and a plurality of leads that radiate outward from the die pad. A hardened, insulative encapsulant material covers the semiconductor chip (or die), die pad, and an inner portion of each of the leads. The semiconductor chip is mounted on the die pad and is electrically connected to the leads. In particular, the chip includes a plurality of bond pads, each of which is electrically connected by a bond wire or the like to a bond finger that is at an inner end of one of the leads. An outer portion of each lead extends outward from the encapsulant material, and serves as an input/output (I/O) terminal for the package. The outer portion of the leads may be bent into various configurations, such as a J lead configuration or a gull wing configuration.

Semiconductor chips that have a high degree of functionality, such as microprocessors, or that are used in high power applications, generate large amounts of heat. Accordingly, packages for such semiconductor chips must have the capacity to dissipate such heat to avoid a malfunction of the packaged chip.

A conventional heat dissipation solution in semiconductor packages includes the provision of a solid, machined copper or aluminum slug, which may or may not have fins, that is embedded in the encapsulant material of the package. Such a heat sink, however, has the drawback of a relatively low efficiency of heat dissipation even when fins are provided. Accordingly, an improved semiconductor package with a more efficient integrated heat sink is needed.

SUMMARY

Embodiments of the present invention include semiconductor packages that have an active heat sink embedded in the package. The active heat sink is in a thermal connection with a semiconductor chip of the package. The encapsulant material of the package encapsulates the chip and a portion of the active heat sink. The chip is electrically connected to a plurality of external terminals of the package. The active heat sink includes a surface exposed to ambient and a cavity partially filled with a heat activated liquid. In some embodiments, an indirect thermal connection is provided between the heat activated liquid and a surface of the chip. Alternatively, a direct thermal connection can be provided between the heat activated liquid and a surface of the chip.

The heat activated liquid boils in response to heat generated during operation of the chip, thereby forming a vapor. The vapor condenses on a juxtaposed inner surface of the active heat sink and transfers heat to an opposite outer surface exposed to ambient to remove heat from the package. The inner and/or outer surfaces of the active heat sink can include fins to increase the surface areas of these surfaces. Optionally, an external heat sink including a plurality of fins can be thermally coupled to the outer surface that is exposed to ambient to further increase the surface area exposed to ambient.

By comparison to conventional heat dissipation solutions in semiconductor packages, the packages of the present invention provide much more efficient heat dissipation. This efficiency can be increased further through the use of fins, which may be included in or on the active heat sink and/or attached externally to the outer surface of the active heat sink that is exposed to ambient.

These and other aspects and features of the present invention will be better understood in new of the following detailed description of the exemplary embodiments and the drawings thereof.

BRIEF DESCRIPTION OF THE DRAWINGS

In the drawings, like or similar features are typically labeled with the same reference numbers.

DETAILED DESCRIPTION

Figure 1:
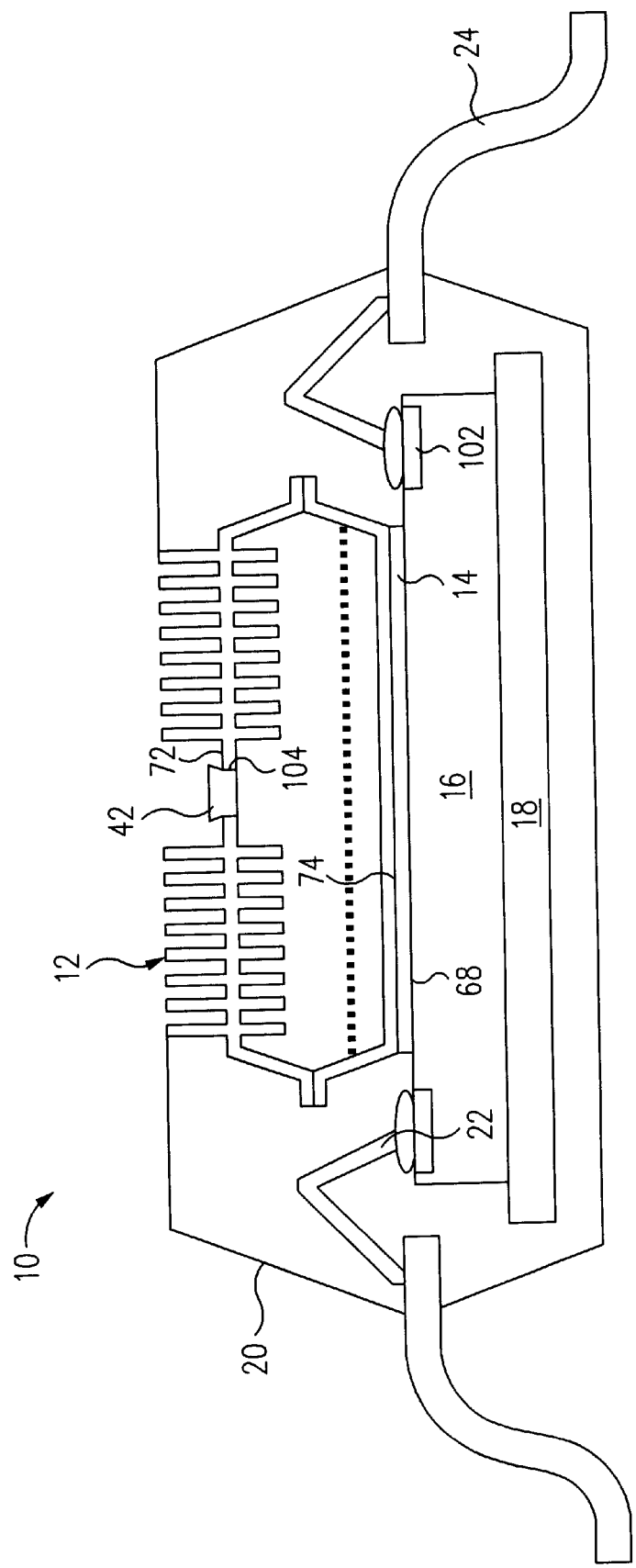
FIG. 1 is a cross-sectional side view of a leadframe semiconductor package having an active heat sink molded into the package according to one embodiment of the present invention.

In accordance with one embodiment of the present invention, FIG. 1 shows a semiconductor package 10 having an active heat sink 12 molded into the package. Package 10 includes a metal leadframe as a substrate. The leadframe includes a planar rectangular central metal die pad 18 and a plurality of leads 24 that extend outwardly adjacent to two or all four sides of die pad 18. In view of the discussion below, however, practitioners will appreciate that packages made in accordance with the present invention may have any number of different substrate configurations. For example, instead of having a leadframe, package 10 may have a printed circuit board substrate, as in a BGA package. The present invention may be employed in virtually any encapsulated semiconductor chip application.

Returning to FIG. 1, a semiconductor chip 16 is mounted on die pad 18. Chip 16 includes a plurality of bond pads 102 arranged in a row adjacent to two or all four peripheral sides of chip 16. Bond pads 102 are each electrically connected by one of a plurality of wire bonds 22 to an inner portion of one the leads 24. An external portion of leads 24 form I/O terminals of package 10.

Active heat sink 12 is in thermal contact with an active surface 68 of chip 16. Active heat sink 12 is a closed vessel that includes a heat activated liquid 46 that cools chip 16 as chip 16 generates heat during operation. A thermally conductive layer 14 thermally couples active surface 68 of chip 16 and a lower surface 74 of active heat sink 12. Chip 16 is thus in an indirect thermal connection with heat activated liquid 46. Thermally conductive layer 14 may comprise, for example, a heat dissipative epoxy or other adhesive. Conductive layer 14 is thermally conductive, but not necessarily electrically conductive. The heat dissipative epoxy embodiment may include, for example, silicon or quartz or other thermally conductive materials in an epoxy base.

Die pad 18, inner portions of leads 24, wire bonds 22, chip 16, thermally conductive layer 14, and active heat sink 12 are encapsulated in an encapsulant 20, which may be formed, for example, by molding an epoxy-based resin compound. The encapsulating process is performed so as to leave an upper portion of active heat sink 12 exposed to ambient to aid in heat dissipation.

Figure 2:
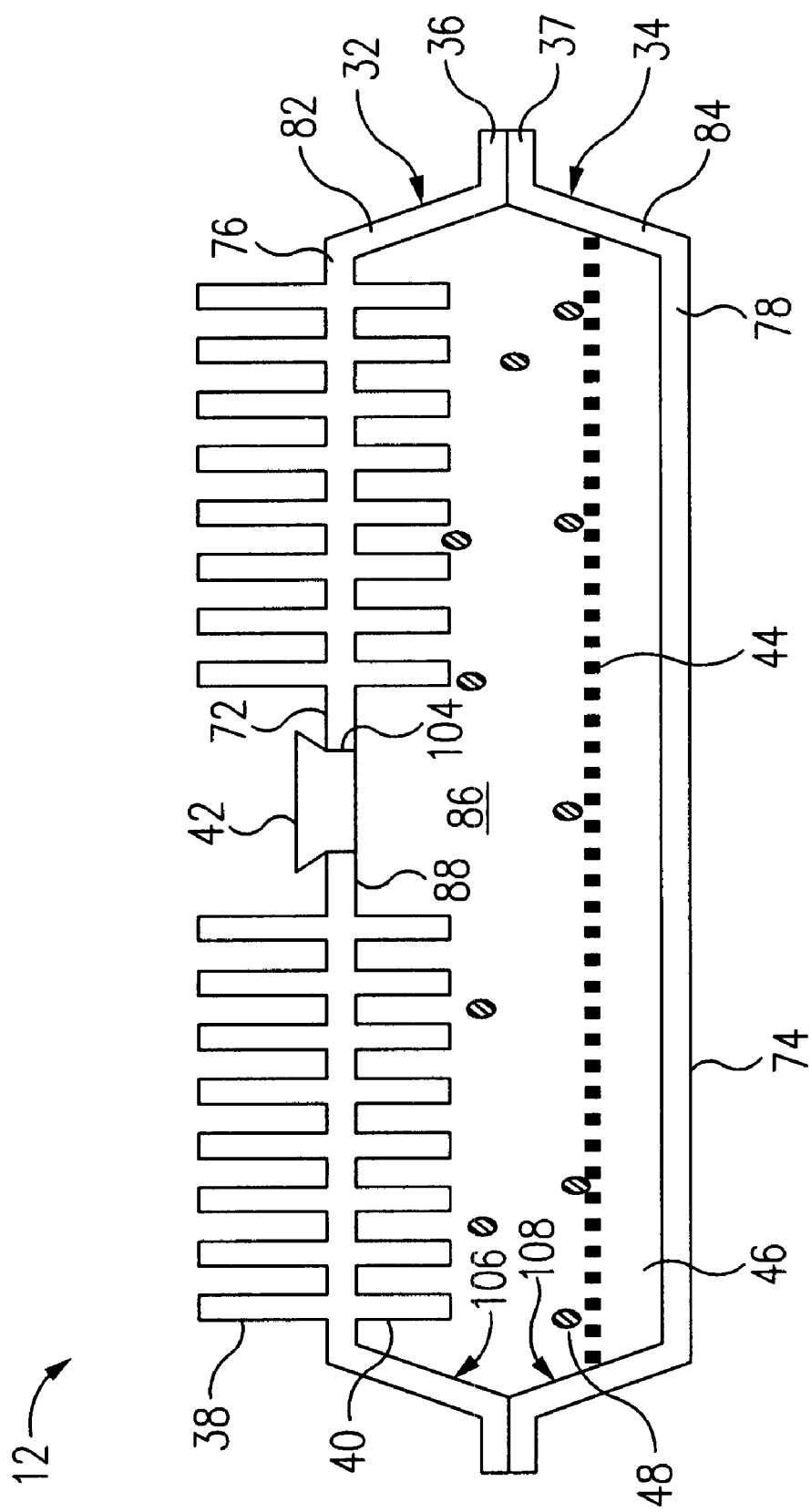
FIG. 2 is a cross-sectional side view of the active heat sink of the package of FIG. 1.

FIG. 2 is a detailed cross-sectional side view of just active heat sink 12 of package 10 of FIG. 1. Active heat sink 12 is a vessel formed of an upper portion 32 joined to a lower portion 34.

Upper portion 32 includes a horizontal rectangular plate 76, an oblique sidewall 82, and a horizontal outward extending flange 36 at a lower end of sidewall 82 fully around upper portion 32. Together, rectangular plate 76 and sidewall 82 define a recess 106 in upper portion 32. A central orifice 104 extends through an upper first surface 72 of upper portion 32. Orifice 104 is shown filled with plug 42. Plug 42 may be a plug of epoxy or solder, or a screw inserted in orifice 104. A plurality of inner fins 40 surrounding orifice 104 and extending into recess 106 increase the surface area of an inner surface 88. Similarly, a plurality of outer fins 38 increase the surface area of first surface 72. First surface 72 includes the outer surface of upper portion 32 extending from the edge of flange 36, along sidewall 82, along rectangular plate 76, along the outer surface of outer fins 38, up to and surrounding orifice 104. As shown in FIG. 1, a portion of first surface 72 including outer fins 38 (as well as orifice 104 and plug 42) remains exposed to ambient in package 10.

Lower portion 34 includes a horizontal rectangular plate 78, an oblique sidewall 84, and a horizontal outward extending flange 37 at an upper end of sidewall 84 fully around lower portion 34. Together, rectangular plate 78 and sidewall 84 define a recess 108 in lower portion 34.

Upper and lower portions 32 and 34 may be formed, for example, by stamping a sheet of stainless steel, nickel, copper, or other easily stamped heat dissipative materials. Alternatively, upper and lower portions 32 and 34 may be formed, for example, by machining aluminum, copper, or other easily machined heat dissipative metals. Outer fins 38, inner fins 40, and orifice 104 can be stamped or machined simultaneously with flange 36, sidewall 82, and rectangular plate 76 of upper portion 32.

After forming, upper portion 32 and lower portion 34 are joined by spot welding or otherwise affixing juxtaposed flanges 36 and 37. Recess 106 of upper portion 32 is juxtaposed with recess 108 of lower portion 34, thereby forming a vessel with internal cavity 86. Cavity 86 is partially filled with heat activated liquid 46. Heat activated liquid 46 is a low boiling point liquid which may be, for example, ethylene glycol.

Active heat sink 12 may optionally include a baffle plate 44 in cavity 86 to reduce any sloshing of heat activated liquid 46 as package 10 is moved during handling or use. Baffle plate 44 can be made of, for example, a screen or a plate with drilled holes.

To make package 10 of FIG. 1, a metal leadframe having a die pad 18 and a plurality of external leads 24 (I/O terminals) is provided. Chip 16 is mounted on die pad 18 using an adhesive. Subsequently, bond pads 102 of chip 16 are each electrically connected to the inner portion of a respective one of leads 24 by a bond wire 22 using a conventional wire bonding machine. The vessel of active heat sink 12, which has cavity 86 and open orifice 104 in first surface 72, but no heat activated liquid 46 therein, is provided. Upper portion 32 of active heat sink 12 may or may not include outer fins 38. The vessel of active heat sink 12 is then thermally coupled to active surface 68 of chip 16, within bond pads 102, using thermally conductive layer 14, which may be a thermally conductive, electrically insulative adhesive, as mentioned above.

Next, the assembly of the leadframe, chip 16, and vessel of active heat sink 12 is placed in a mold cavity. The inner surface of the top mold die contacts outer fins 38 of upper portion 32 of the vessel of active heat sink 12. In particular, the top surface of outer fins 38 contacts the inner surface of the top mold die. Orifice 104 through first surface 72 is left open.

An encapsulant 20, such as a mold compound, is then injected into the mold at high temperature (e.g., typically near 160° C.) and allowed to cool and harden. The molten encapsulant is prevented from reaching orifice 104, which remains open. Having open orifice 104 through first surface 72 allows pressure in cavity 86 to equalize during the encapsulating process. As a result of the molding process, the central portion of first surface 72 is not covered by encapsulant 20, but rather is left exposed to ambient.

Subsequently, the molded assembly is removed from the mold and cleaned, if necessary, to remove excess encapsulant. Next, cavity 86 is partially filled with heat activated liquid 46 through open orifice 104 through first surface 72. Orifice 104 is subsequently sealed with plug 42, thereby completing the assembly of active heat sink 12. Conventional debar, dejunk, trim, and form steps may then be done to finish package 10.

Cavity 86 of active heat sink 12 is filled only partially with heat activated liquid 46 in this embodiment. The partial filling allows room for heat activated liquid 46 to boil, at about 80–90° C., in response to heat generated in underlying chip 16 during operation. As a result of this boiling, a plurality of vapor molecules 48 of heat activated liquid 46 rise and condense on inner surface 88 of upper portion 32, thereby transferring heat to upper portion 32. A central portion of opposite first surface 72 of upper portion 32 is exposed to ambient allowing radiation and convection by airflow, which increases the temperature gradient that causes the condensation, to complete the heat dissipation process. The heat dissipation process can be made more efficient by increasing the surface areas of inner surface 88 (using inner fins 40) and first surface 72 (using outer fins 38) of upper portion 32.

Figure 3:
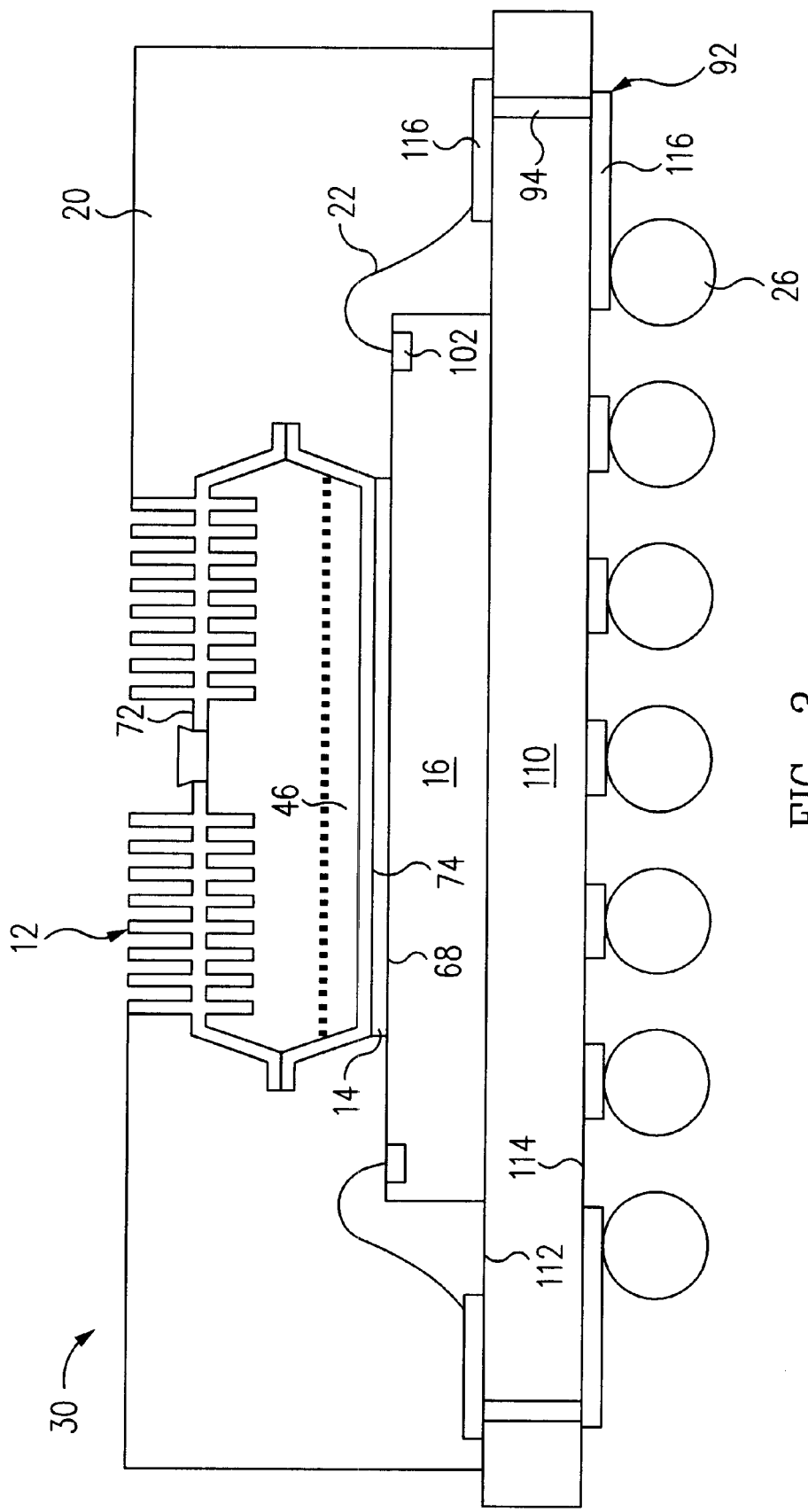
FIG. 3 is a cross-sectional side view of a ball grid array semiconductor package having an active heat sink molded into the package according to another embodiment of the present invention.

FIG. 3 is a cross-sectional side view of a ball grid array (BGA) package 30 with an active heat sink 12 molded into package 30 in accordance with another embodiment of the present invention. Package 30 is similar to package 10 of FIG. 1 and is labeled with many similar reference numbers. Accordingly, to avoid redundancy, our discussion will focus on differences between package 30 and package 10.

The chief difference between package 30 of FIG. 3 and package 10 of FIG. 1 is that the lead frame substrate, including die pad 18, is replaced by a circuit board substrate 110, as is conventional in BGA style packages. In BGA package 30, bond pads 102 of chip 16 are each electrically connected by a wire bond 22 to one of a plurality of conductive traces 116 on a first surface 112 of circuit board substrate 110. Each conductive trace 116 on upper first surface 112 is electrically connected to a conductive trace 116 on a second surface 114 of substrate 110 using a via 94 that extends through substrate 110 from first surface 112 to second surface 114. Metal contacts 26 (e.g., solder balls) are each electrically connected to respective conductive traces 116 on lower second surface 114 of circuit board substrate 110 and serve as I/O terminals of package 30. Conductive traces 116 and vias 94 form conductive paths 92 on and through substrate 110 routing signals between chip 16 and the I/O terminals (e.g., metal contacts 26).

Similarly to package 10 of FIG. 1, package 30 includes an active heat sink 12 that is embedded in encapsulant 20 and is in thermal contact with chip 16. As in package 10, package 30 provides an indirect thermal connection between heat activated liquid 46 and chip 16. The method of making package 30 is substantially similar to the above-described method of making package 10, except for the change in the substrate. Minor changes to the assembly method to accommodate the circuit board substrate 110, versus the leadframe substrate including die pad 18 of package 10, will be apparent to practitioners.

Figure 5:
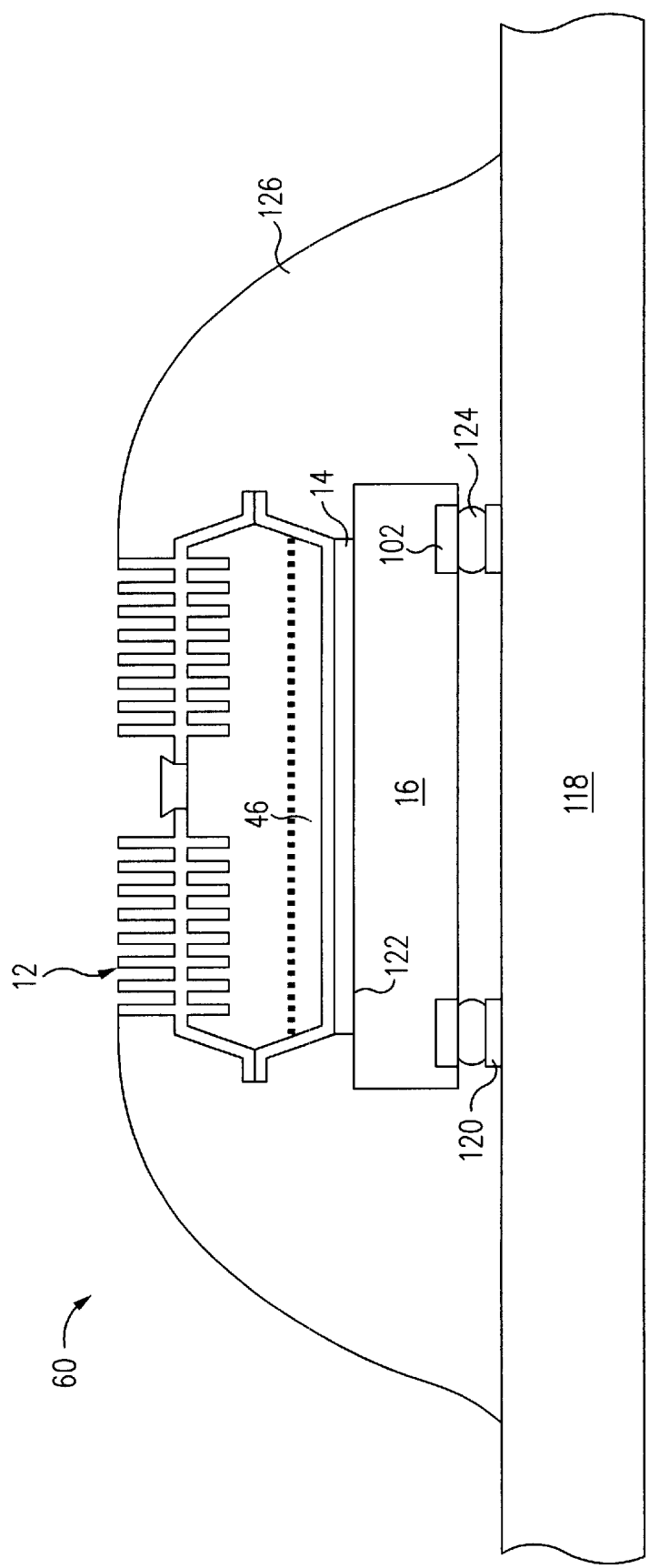
FIG. 5 is a cross-sectional side view of a semiconductor assembly having an active heat sink according to another embodiment of the present invention.

In view of the discussion above, practitioners will appreciate that the present invention is not limited by the type of substrate upon which the chip to be cooled is mounted. For instance, FIG. 5 shows a cross-sectional side view of a semiconductor assembly 60 having an active heat sink 12 in accordance with another embodiment of the present invention. In assembly 60, chip 16 is mounted in a flip chip configuration on a motherboard 118. Each bond pad 102 of chip 16 is electrically connected to a respective conductive terminal 120 of motherboard 118 using a solder bump 124. Active heat sink 12 is thermally connected to an inactive surface 122 of chip 16 opposite motherboard 118 using a thermally conductive layer 14. A glob top encapsulant 126 covers the periphery of active heat sink 12 and chip 16. Active heat sink 12 cools chip 16 during operation in the manner described above. As in package 10 of FIG. 1 and package 30 of FIG. 3, assembly 60 of FIG. 5 provides an indirect thermal connection between heat activated liquid 46 of active heat sink 12 and chip 16.

Figure 6:
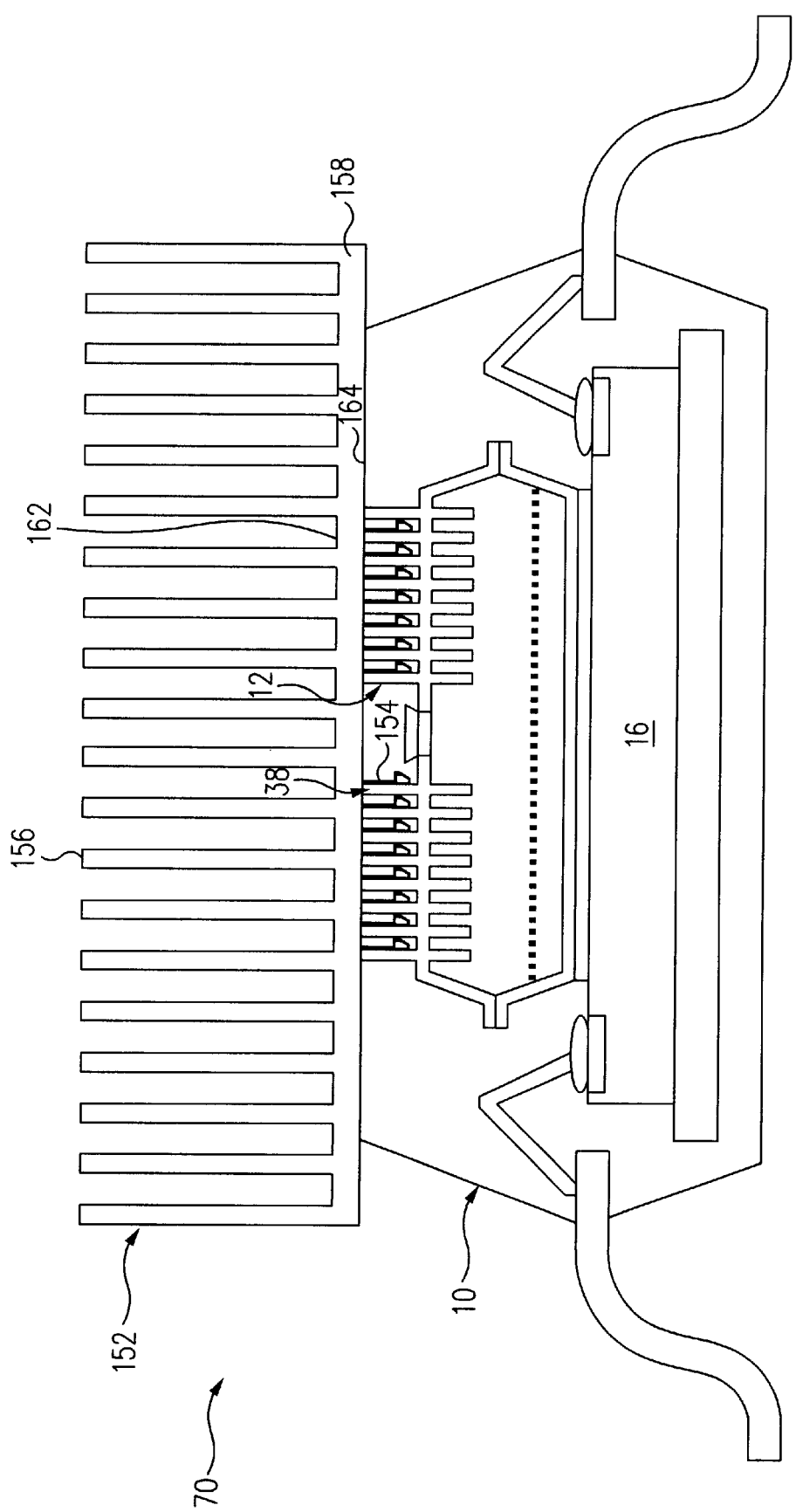
FIG. 6 is a cross-sectional side view of an assembly including a semiconductor package with an active heat sink and an external heat sink according to another embodiment of the present invention.

In view of the discussion above, practitioners will appreciate that heat dissipation may be increased in packages in accordance with the present invention by using an optional external heat sink. For instance, FIG. 6 shows a cross-sectional side view of an assembly 70 including a semiconductor package 10, as shown in FIG. 1, with an active heat sink 12 and an external heat sink 152. Heat sink 152 includes a plurality of orthogonal fins 156 extending from an upper surface 162 of a horizontal rectangular base plate 158.

A plurality of barbed projections 154 extending from a lower surface 164 of rectangular base plate 158 are spaced so as to extend into and engage outer fins 38 of active heat sink 12 of package 10 by a friction force. The barbed projections 154 compress upon engagement with outer fins 38 of package 10, and the restoring spring force of compressed barbed projections 154 provides the resistance to removal of external heat sink 152. The result is a "snap-on" attachment of external heat sink 152 to package 10. Heat sink 152 may be formed, for example, by stamping aluminum, copper, or other metals.

When package 70 of FIG. 6 is in operation, heat generated by chip 16 is transferred, as described above, to outer fins 38. Attachment of external heat sink 152 to active heat sink 12 of package 10 allows heat conduction (due to physical and thermal contact) from outer fins 38 of active heat sink 12, to barbed projections 154, rectangular base plate 158, and fins 156 of external heat sink 152. The surface area exposed to ambient is thereby increased, so as to now include the external surfaces of all of fins 156, upper surface 162, and a portion of lower surface 164 of external heat sink 152. The larger surface area exposed to ambient increases the heat dissipation capability of package 10. Practitioners will appreciate that external heat sink 152 may be attached to any package including a heat sink with outer fins 38, including, for example, the embodiments of FIG. 3 and FIG. 5.

In some embodiments of the present invention, the outer surface (that is exposed to ambient) of the active heat sink does not include fins but rather is planar. In such embodiments, external heat sink 152 can be modified for use by removing barbed projections 154. The lower surface 164 of rectangular base plate 158 can be attached to the exposed surface of the active heat sink using a thermally conductive material, such as solder paste or thermally conductive epoxy. (See the discussion of FIG. 7 below.)

In some embodiments, for example as shown in FIG. 1, FIG. 3, and FIG. 5, active heat sink 12 is a closed vessel with lower surface 74 of lower portion 34 in thermal contact with both chip 16 (via thermally conductive layer 14) and heat activated liquid 46. This provides an indirect thermal connection between heat activated liquid 46 of active heat sink 12 and chip 16. It is possible to provide, however, a direct thermal connection between chip 16 and heat activated liquid 46.

Figure 4:
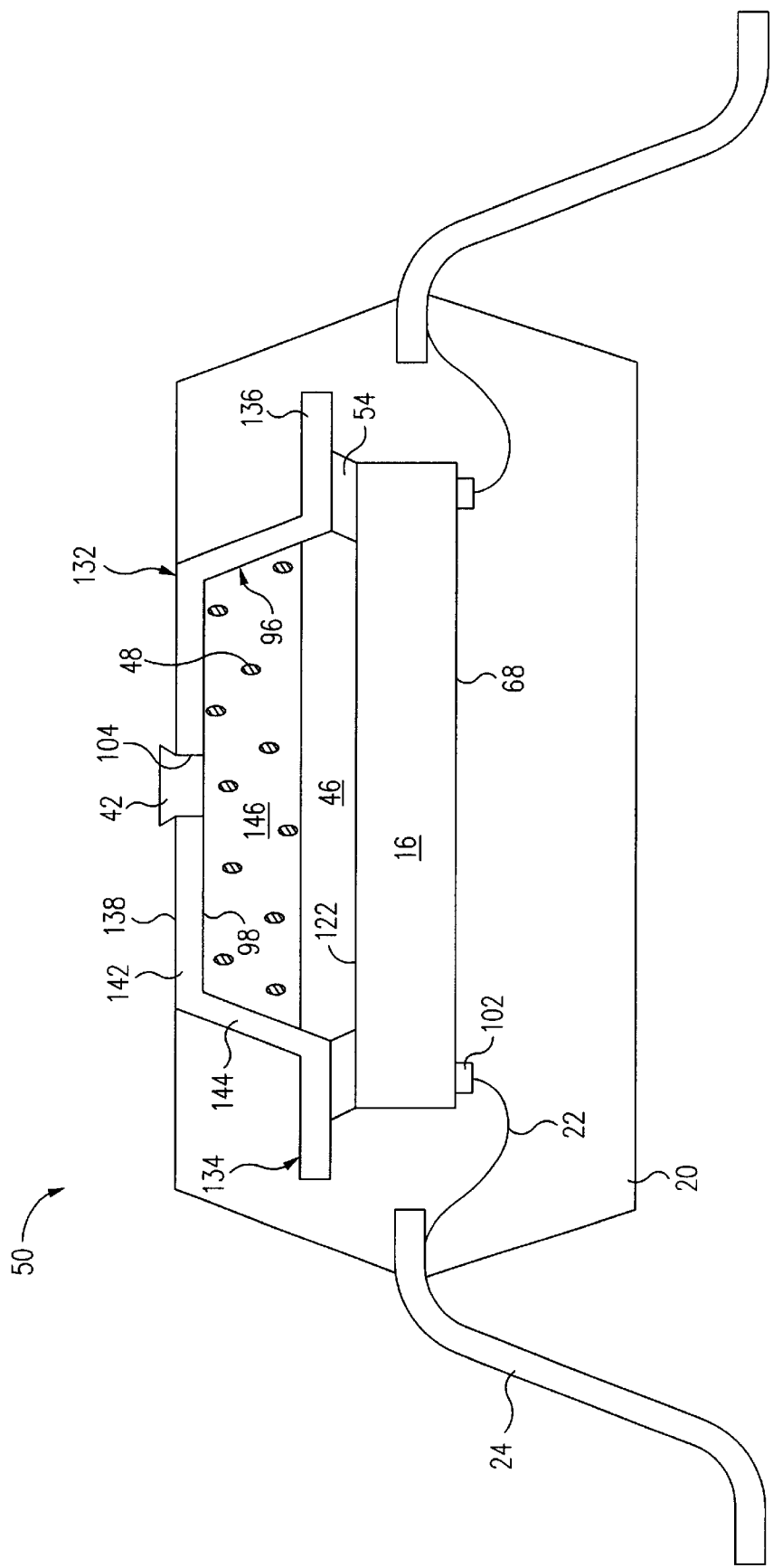
FIG. 4 is a cross-sectional side view of a leadframe semiconductor package having an active heat sink according to another embodiment of the present invention.

In an alternative embodiment of the present invention, an active heat sink 132 is provided wherein there is direct physical and thermal contact between chip 16 and heat activated liquid 46 of active heat sink 132. For example, FIG. 4 is a cross-sectional side view of a leadframe package 50 with active heat sink 132 molded into package 50. Package 50 is similar to package 10 of FIG. 1 and is labeled with many similar reference numbers. Accordingly, to avoid redundancy, our discussion will focus on differences between package 50 and package 10.

An upper portion 134 of active heat sink 132 is formed directly from the metal die pad, which is analogous to die pad 18 of package 10 of FIG. 1, of the leadframe. Unlike in package 10, however, the die pad of package 50 is stamped into upper portion 134 to include a central horizontal planar rectangular plate 142, an oblique sidewall 144, and an outward extending flange 136 at a lower end of sidewall 144 fully around upper portion 134. Upper portion 134 includes a central recess 96 defined by plate 142 and sidewall 144. An orifice 104, shown filled with plug 42, is provided through a central portion of rectangular plate 142 of upper portion 134.

Upper portion 134 is bonded to inactive surface 122 of chip 16 with a seal 54. In particular, seal 54 seals a peripheral portion of inactive surface 122 fully around chip 16 to flange 136 of upper portion 134. Seal 54 may be, for example, a solder paste, an epoxy, or a solder, such as gold tin solder. Seal 54 may be a thermally conductive material so that inactive surface 122 of chip 16 is thermally connected to upper portion 134 of active heat sink 132 through seal 54. Together, upper portion 134 and inactive surface 122 of chip 16 define a cavity 146 hat is accessed through orifice 104.

A plurality of bond pads 102 on active surface 68 of chip 16 are each electrically connected, using respective wire bonds 22 and a conventional wire bonder, to inner portions of respective leads 24 of package 50. Leads 24 form the I/O terminals of package 50.

Chip 16 and upper portion 134 are encapsulated in encapsulant 20, which may be formed by molding an epoxy or other resinous molding compound. As discussed above, the molding process is performed so as to leave a first surface 138 of rectangular plate 142 of upper portion 134 exposed to ambient to aid in heat dissipation. As with package 10 of FIG. 1, orifice 104 remains open during the encapsulation process, which allows the pressure in cavity 146 to equalize during the molding process, thus preventing explosion of the structure.

After molding, cavity 146 is partially filled through orifice 104 with heat activated liquid 46. Orifice 104 is subsequently sealed with plug 42, which may be a plug of epoxy or solder, or a screw inserted in orifice 104. Cavity 146 of active heat sink 132 is closed by seal 54 and plug 42, so that heat activated liquid 46 remains in cavity 146 between upper portion 134 and inactive surface 122 of chip 16. Heat activated liquid 46 is directly exposed to inactive surface 122 of chip 16 thus providing a direct thermal connection between chip 16 and heat activated liquid 46 of active heat sink 132.

As discussed above, cavity 146 of active heat sink 132 is only partially filled with heat activated liquid 46, which allows room for heat activated liquid 46 to boil in cavity 146 in response to heat generated in underlying chip 16. This allows vapor molecules 48 created by the boiling of heat activated liquid 46 to rise and condense on an inner surface 98 of rectangular plate 142, thereby transferring heat from chip 16 to first surface 138 of rectangular plate 142 of upper portion 134, which is exposed to ambient. Additional heat fins (not shown) can be bonded to first surface 138 of rectangular plate 142 of upper portion 134 to yield an increased surface area exposed to ambient, thereby increasing the efficiency of the heat dissipation.

Figure 7:
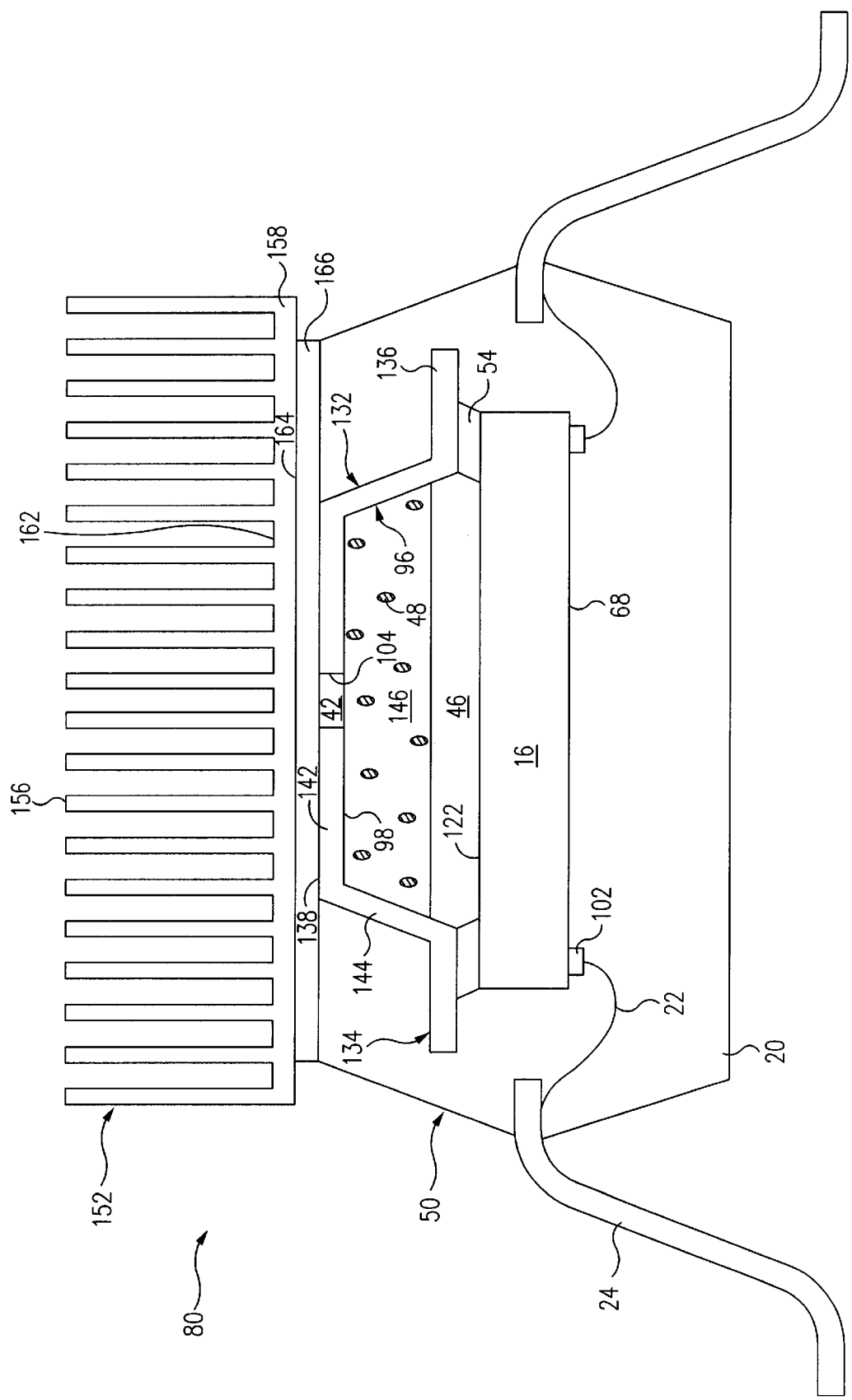
FIG. 7 is a cross-sectional side view of an assembly including a semiconductor package with an active heat sink and an external heat sink according to another embodiment of the present invention.

FIG. 7 is a cross-sectional side view of an assembly 80 including a semiconductor package 50 with an active heat sink 132 and an external heat sink 152 according to another embodiment of the present invention. FIG. 7 shows the package embodiment of FIG. 4 combined with an embodiment of the external heat sink of FIG. 6. The major difference is that barbed projections 154 have been removed from external heat sink 152. Lower surface 164 of external heat sink 152 is attached to first surface 138 of active heat sink 132 of package 50 using a thermally conductive material 166, which may be a solder paste or thermally conductive epoxy. Further, the top of plug 42 is made to be flush with, or substantially flush with, first surface 138. Other aspects of package 50 and external heat sink 152 are as described above.

The exemplary packages and mountings described above include an embedded active heat sink to cool the semiconductor chip during operation. This improves the efficiency of heat dissipation compared to prior art solutions. Better heat dissipation makes for a more reliable package and reduces the likelihood of chip failure due to overheating.

Of course, the embodiments of the present invention provided above are exemplary only. Practitioners may well see variations possible in view of our teachings. Accordingly, the present invention includes all that fits within the literal and equitable scope of the appended claims.

We claim:

1. An electronic assembly comprising:
a semiconductor chip electrically connected to a substrate;
an active heat sink coupled to said chip, said heat sink including a heat activated liquid in a thermal connection with said chip, and a first surface exposed to ambient; and
an encapsulant material covering said chip and a portion of said active heat sink.

2. The electronic assembly of claim 1, wherein said assembly is within a semiconductor package.

3. The electronic assembly of claim 1, wherein said thermal connection comprises a direct thermal connection between said heat activated liquid and a surface of said chip.

4. The electronic assembly of claim 1, wherein said substrate comprises a leadframe of a semiconductor package, said leadframe including a die pad on which said chip is mounted and a plurality of leads to which said chip is electrically connected.

5. The electronic assembly of claim 4, wherein said die pad includes said first surface, a recess with said heat activated liquid therein, and a sealed orifice through said first surface into said recess, and said chip is bonded to said die pad over said recess and is exposed to said heat activated liquid enclosed therein.

6. The electronic assembly of claim 2, wherein said substrate comprises a printed circuit board.

7. The electronic assembly of claim 1, wherein said substrate comprises an insulative layer with conductive traces thereon, said chip being electrically connected to said traces.

8. The electronic assembly of claim 1, wherein said heat sink includes a sealed orifice in said first surface.

9. The electronic assembly of claim 1, wherein said thermal connection comprises an indirect thermal connection between said heat activated liquid and said chip.

10. The electronic assembly of claim 9, wherein said indirect thermal connection comprises a thermally conductive material connected between a second surface of said active heat sink and an active surface of said chip, said second surface being in a thermal connection with said heat activated liquid.

11. The electronic assembly of claim 2, wherein said heat sink is a closed hollow vessel including a cavity enclosing said heat activated liquid therein.

12. The electronic assembly of claim 11, wherein said vessel includes a baffle plate in said cavity.

13. The electronic assembly of claim 1, wherein said active heat sink includes fins adjacent to said first surface and exposed to ambient.

14. The electronic assembly of claim 1, wherein said active heat sink includes fins adjacent to said first surface and exposed to said heat activated liquid.

15. The electronic assembly of claim 1, wherein said assembly further comprises an external heat sink thermally coupled to said first surface, said external heat sink including a plurality of fins.

16. An electronic assembly comprising:
a semiconductor chip electrically connected to a substrate; and
an active heat sink coupled to said chip, said heat sink including a heat activated liquid in a thermal connection with said chip, and a first surface exposed to ambient, wherein said thermal connection comprises a direct thermal connection between said heat activated liquid and a surface of said chip.

17. The electronic assembly of claim 16, wherein said assembly further comprises an encapsulant material covering said chip and a portion of said active heat sink.

18. The electronic assembly of claim 16, wherein said assembly is within a semiconductor package.

19. The electronic assembly of claim 16, wherein said substrate comprises a leadframe of a semiconductor package, said leadframe including a die pad on which said chip is mounted and a plurality of leads to which said chip is electrically connected.

20. The electronic assembly of claim 16, wherein said die pad includes said first surface, a recess with said heat activated liquid therein, and a sealed orifice through said first surface into said recess, and said chip is bonded to said die pad over said recess and is exposed to said heat activated liquid enclosed therein.

21. The electronic assembly of claim 16, wherein said substrate comprises an insulative layer with conductive traces thereon, said chip being electrically connected to said traces.

22. The electronic assembly of claim 16, wherein said heat sink includes a sealed orifice in said first surface.

23. A semiconductor package comprising:
   a semiconductor chip electrically connected to a plurality of external terminals;
   an active heat sink coupled to said chip, said heat sink including a heat activated liquid in a thermal connection with said chip, and a first surface exposed to ambient; and
   an encapsulant material covering said chip and a portion of said active heat sink.

24. The semiconductor package of claim 23, wherein said semiconductor package further comprises a substrate upon which said chip is mounted, said substrate including said external terminals.

25. The semiconductor package of claim 24, wherein said substrate comprises a leadframe including a die pad on which said chip is mounted and a plurality of leads to which said chip is electrically connected, said leads being said external terminals.

26. The semiconductor package of claim 25, wherein said die pad includes said first surface, a recess with said heat activated liquid therein, and a sealed orifice through said first surface into said recess, and said chip is bonded to said die pad over said recess and is exposed to said heat activated liquid enclosed therein.

27. The semiconductor package of claim 24, wherein said substrate comprises an insulative layer with conductive traces thereon and said external terminals are provided on said substrate, said chip being electrically connected to said external terminals through said traces.

28. The semiconductor package of claim 23, wherein said thermal connection comprises an indirect thermal connection between said heat activated liquid and said chip.

29. The semiconductor package of claim 23, wherein said indirect thermal connection comprises a thermally conductive material connected between a second surface of said active heat sink and an active surface of said chip, said second surface being in a thermal connection with said heat activated liquid.

30. The semiconductor package of claim 23, wherein said heat sink is a closed hollow vessel including a cavity enclosing said heat activated liquid therein.

31. The semiconductor package of claim 30, wherein said vessel includes a baffle plate in said cavity.

32. The semiconductor package of claim 23, wherein said active heat sink includes fins adjacent to said first surface and exposed to ambient.

33. The semiconductor package of claim 32, wherein said package further comprises an external heat sink thermally coupled to said fins of said active heat sink, said external heat sink including a plurality of fins.

34. The electronic assembly of claim 23, wherein said active heat sink includes fins adjacent to said first surface and exposed to said heat activated liquid.

35. The semiconductor package of claim 23, wherein said thermal connection comprises a direct thermal connection between said heat activated liquid and a surface of said chip.

36. The semiconductor package of claim 23, wherein said package further comprises an external heat sink thermally coupled to said first surface, said external heat sink including a plurality of fins.

37. A semiconductor package comprising:
   a semiconductor chip electrically connected to a plurality of external terminals;
   an active heat sink coupled to said chip, said heat sink including a heat activated liquid in a thermal connection with said chip, and a first surface exposed to ambient;
   an encapsulant material covering said chip and a portion of said active heat sink; and
   a sealed orifice in said first surface.

38. A semiconductor package comprising:
   a semiconductor chip comprising an active surface and an opposite back surface;
   a plurality of bond pads on said active surface electrically connected to a plurality of external terminals of the package;
   a die pad comprising a recess, a first surface exposed to ambient, and a sealed orifice through said first surface into said recess, said back surface of said chip bonded to said die pad over said recess opposite said orifice, thereby forming an enclosed cavity;
   a heat activated liquid in said cavity and exposed to said back surface of said chip, said heat activated liquid being adapted to cool said chip during operation; and
   an encapsulant material covering said chip and a portion of said die pad.

39. A method of making an electronic assembly, comprising the steps of:
   providing a substrate including a plurality of terminals;
   mounting a chip on said substrate and electrically connecting said chip to said plurality of terminals of said substrate;
   providing a vessel having a central cavity, a first surface, and an orifice through said first surface into said cavity;
   coupling said vessel to said chip;
   encapsulating said chip and a portion of said vessel in an encapsulant material, wherein a portion of said first surface of said encapsulated vessel is exposed to ambient;
   filling said vessel with a heat activated liquid through said orifice, said liquid adapted to cool said chip during operation of said chip, wherein a thermal connection is established between said heat activated liquid and said chip; and
   sealing said orifice.

40. The method of claim 39, wherein said encapsulating step is done before said filling step and said sealing step, and said orifice is located in the exposed portion of the first surface.

41. A method of making a semiconductor package, comprising the steps of:
   providing a substrate including a plurality of terminals;
   mounting a chip on said substrate and electrically connecting said chip to said plurality of terminals;
   providing a vessel having a central cavity, a first surface, and an orifice through said first surface into said cavity;
   coupling said vessel to said chip;

encapsulating said chip and a portion of said vessel in an encapsulant material, wherein a portion of said first surface of said encapsulated vessel is exposed to ambient;

filling said vessel with a heat activated liquid through said orifice, said liquid adapted to cool said chip during operation of the chip, wherein a thermal connection is established between said heat activated liquid and said chip; and sealing said orifice.

42. The method of claim 41, wherein said method further comprises thermally coupling a heat sink to said first surface of said vessel, said heat sink including a plurality of fins.

43. The method of claim 41, wherein said coupling step comprises bonding said vessel to said chip using a thermally conductive material.

44. The method of claim 41, wherein said vessel further includes an opening opposite said orifice, and said coupling step comprises bonding a surface of said chip to said vessel so as to cover said opening, and said surface of said chip is exposed to said heat activated liquid after said filling step, thereby establishing a direct thermal connection between said heat activated liquid and said chip.

45. The method of claim 41, wherein said vessel is a closed vessel except for said orifice, and said coupling step comprises bonding a second surface of said vessel opposite said orifice to a surface of said chip, and said heat activated liquid is enclosed within said vessel after said filling step and said sealing step, thereby establishing an indirect thermal connection between said heat activated liquid and said chip.

46. The method of claim 41, wherein said substrate comprises a leadframe including a die pad on which said chip is mounted and a plurality of leads to which said chip is electrically connected, said leads being said terminals, and said encapsulating step covers a portion of said leadframe.

47. The method of claim 41, wherein said substrate comprises an insulative layer with conductive traces thereon to which said terminals are electrically connected, and wherein electrically connecting said chip to said terminals comprises electrically connecting said chip to said traces.

48. The method of claim 41, wherein said encapsulating step is done before said filling step and said sealing step, and said orifice is located in the exposed portion of the first surface.

* * * * *

UNITED STATES PATENT AND TRADEMARK OFFICE
CERTIFICATE OF CORRECTION

PATENT NO. : 6,429,513 B1
DATED : August 6, 2002
INVENTOR(S) : Charles A. Shermer, IV et al.

It is certified that error appears in the above-identified patent and that said Letters Patent is hereby corrected as shown below:

Column 2,
Line 8, delete "new" and insert -- view --; and

Column 6,
Line 61, delete "hat" and insert -- that --.

Signed and Sealed this

Eighteenth Day of March, 2003

JAMES E. ROGAN
*Director of the United States Patent and Trademark Office*